United States Patent
Ilievski et al.

(10) Patent No.: US 10,615,306 B2
(45) Date of Patent: Apr. 7, 2020

(54) METHOD OF SEPARATING LIGHT EMITTING DEVICES FORMED ON A SUBSTRATE WAFER

(71) Applicant: Lumileds LLC, San Jose, CA (US)

(72) Inventors: Filip Ilievski, San Jose, CA (US); Norbertus Antonius Maria Sweegers, Lierop (NL); Kwong-Hin Henry Choy, Sunnyvale, CA (US); Marc Andre De Samber, Lommel (BE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/134,441

(22) Filed: Sep. 18, 2018

(65) Prior Publication Data

US 2019/0103508 A1 Apr. 4, 2019

Related U.S. Application Data

(63) Continuation of application No. 14/906,539, filed as application No. PCT/IB2014/062784 on Jul. 2, 2014, now Pat. No. 10,079,327.

(60) Provisional application No. 61/856,857, filed on Jul. 22, 2013.

(51) Int. Cl.
*H01L 33/00* (2010.01)
*H01L 21/78* (2006.01)
*H01L 33/20* (2010.01)

(52) U.S. Cl.
CPC ........ *H01L 33/0095* (2013.01); *H01L 33/007* (2013.01); *H01L 33/0079* (2013.01); *H01L 21/78* (2013.01); *H01L 33/20* (2013.01)

(58) Field of Classification Search
None
See application file for complete search history.

(56) References Cited

U.S. PATENT DOCUMENTS

| | | |
|---|---|---|
| 6,576,488 B2 | 6/2003 | Collins, III et al. |
| 6,818,532 B2 | 11/2004 | Yeom et al. |
| 7,420,218 B2 | 9/2008 | Nagai |
| 7,566,635 B2 | 7/2009 | Fujii et al. |
| 7,858,414 B2 | 12/2010 | Fudeta et al. |
| 8,232,564 B2 | 7/2012 | Chakraborty |
| 8,324,083 B2 | 12/2012 | Uemura et al. |
| 8,350,285 B2 | 1/2013 | Sugizaki et al. |
| 8,415,697 B2 | 4/2013 | Furukawa |
| 8,426,325 B2 | 4/2013 | Wang et al. |

(Continued)

FOREIGN PATENT DOCUMENTS

| | | |
|---|---|---|
| CN | 101930942 | 12/2010 |
| EP | 1376687 | 1/2004 |

(Continued)

OTHER PUBLICATIONS

EPO as ISA, PCT/182014/062784, filed Jul. 2, 2014, "International Search Report and Written Opinion" dated Oct. 27, 2014, 12 pages.

*Primary Examiner* — Whitney Moore
(74) *Attorney, Agent, or Firm* — Volpe and Koenig, P.C.

(57) ABSTRACT

A method according to embodiments of the invention includes providing a light emitting semiconductor structure grown on a substrate. The substrate has a front side and a back side opposite the front side. Notches are formed in the substrate. The notches extend from the front side of the substrate into the substrate. After forming notches in the substrate, the back side of the substrate is thinned to expose the notches.

10 Claims, 7 Drawing Sheets

(56) References Cited

U.S. PATENT DOCUMENTS

| | | |
|---|---|---|
| 2002/0076904 A1 | 6/2002 | Imler |
| 2005/0186760 A1 | 8/2005 | Hashimura et al. |
| 2006/0094207 A1 | 5/2006 | Yoo |
| 2009/0029499 A1 | 1/2009 | Nakahara |
| 2009/0294784 A1 | 12/2009 | Nakahara et al. |
| 2010/0233835 A1 | 9/2010 | Kusunoki |
| 2010/0267219 A1 | 10/2010 | Kajiyama |
| 2011/0284906 A1 | 11/2011 | Lin et al. |
| 2013/0029445 A1 | 1/2013 | Kim et al. |
| 2013/0140592 A1 | 6/2013 | Lee et al. |

FOREIGN PATENT DOCUMENTS

| | | |
|---|---|---|
| JP | 2003-007929 A | 1/2003 |
| JP | 2004-221536 A | 8/2004 |
| WO | 2005/122223 | 12/2005 |
| WO | 2013/094083 | 6/2013 |

METHOD OF SEPARATING LIGHT EMITTING DEVICES FORMED ON A SUBSTRATE WAFER

FIELD OF THE INVENTION

The present invention relates to methods for separating light emitting devices grown on a substrate wafer.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

In some LEDs the growth substrate remains part of the final device structure, for example to provide mechanical stability to the semiconductor structure. A significant amount of light may be emitted through the sides of the growth substrate. Side light emission from the substrate is undesirable in applications that require or prefer that most or all of the light be emitted from the top of the device.

US 2010/0267219 describes a method of thinning the growth substrate. According to the abstract, the method includes "a sapphire substrate grinding step of grinding the back side of the sapphire substrate; a modified layer forming step of applying a laser beam to the sapphire substrate from the back side thereof to thereby form a modified layer in the sapphire substrate along each street, . . . and a wafer dividing step of breaking the sapphire substrate along each street where the modified layer is formed".

SUMMARY

It is an object of the invention to provide a method of separating light emitting devices grown on a substrate by forming notches in the substrate, then thinning the substrate to expose the notches.

A method according to embodiments of the invention includes providing a light emitting semiconductor structure grown on a substrate. The substrate has a front side and a back side opposite the front side. Notches are formed in the substrate. The notches extend from the front side of the substrate into the substrate. After forming notches in the substrate, the back side of the substrate is thinned to expose the notches.

A method according to embodiments of the invention includes growing on a first surface of a sapphire substrate a semiconductor structure including a light emitting layer disposed between an n-type region and a p-type region. The semiconductor structure is formed into a plurality of LEDs. Cracks are formed in the sapphire substrate. The cracks extend from the first surface of the sapphire substrate and do not penetrate an entire thickness of the sapphire substrate. After forming cracks in the sapphire substrate, the sapphire substrate is thinned from a second surface of the sapphire substrate. The second surface is opposite the first surface.

DETAILED DESCRIPTION

In embodiments of the invention, a sapphire or other growth substrate remains part of the final device structure, but is thinned to reduce or eliminate light emission from the sides of the growth substrate. In embodiments of the invention, the wafer is first partially separated by forming separation zones, which are often notches or cracks in the substrate, through at least part of the thickness of the substrate. The wafer is then fully separated by thinning the substrate until the separation zones are reached. Embodiments of the invention are particularly suited to applications that require all or a significant portion of light to be emitted from the top surface of a device, such as some automotive applications.

Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
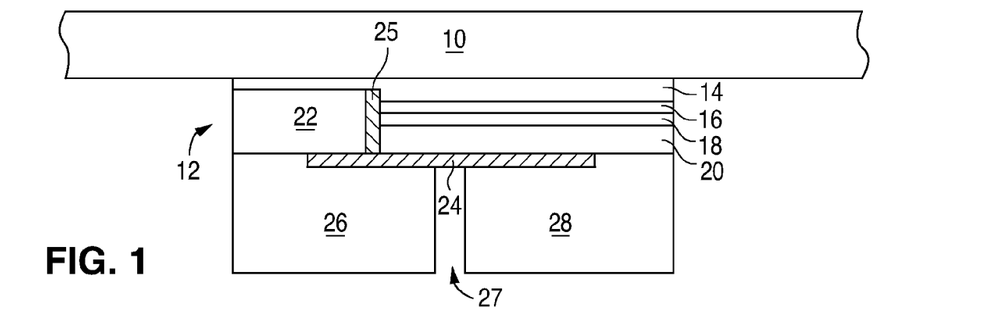
FIG. 1 illustrates one example of a III-nitride LED.

FIG. 1 illustrates a single III-nitride LED 12 that may be used in embodiments of the present invention. Any suitable semiconductor light emitting device may be used and embodiments of the invention are not limited to the device illustrated in FIG. 1. The device of FIG. 1 is formed by growing a III-nitride semiconductor structure on a portion of a growth substrate 10 as is known in the art. The growth substrate is often sapphire but may be any suitable substrate such as, for example, SiC, Si, GaN, or a composite substrate. The semiconductor structure includes a light emitting or active region sandwiched between n- and p-type regions. An n-type region 14 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 16 is grown over the n-type region 14. Examples of suitable light emitting regions include a single thick or thin light emitting layer, or a multiple quantum well light emitting region including multiple thin or thick light emitting layers separated by barrier layers. A p-type region 18 may then be grown over the light emitting region 16. Like the n-type region 14, the p-type region 18 may include multiple layers of different composition, thickness, and dopant concentration, including layers that are not intentionally doped, or n-type layers.

After growth, a p-contact 20 is formed on the surface of the p-type region. The p-contact 20 often includes multiple conductive layers such as a reflective metal and a guard metal which may prevent or reduce electromigration of the reflective metal. The reflective metal is often silver but any suitable material or materials may be used. After forming the p-contact 20, a portion of the p-contact 20, the p-type region 18, and the active region 16 is removed to expose a portion of the n-type region 14 on which an n-contact 22 is formed. The n- and p-contacts 22 and 20 are electrically isolated from each other by a gap 25, shown hatched, which may be filled with a dielectric such as an oxide of silicon or any other suitable material. Multiple n-contact vias may be formed; the n- and p-contacts 22 and 20 are not limited to the arrangement illustrated in FIG. 1. The n- and p-contacts may be redistributed to form bond pads with a dielectric/metal stack, as is known in the art.

In order to form electrical connections to the LED 12, one or more interconnects 26 and 28 are formed on or electrically connected to the n- and p-contacts 22 and 20. Interconnect 26 is electrically connected to n-contact 22 in FIG. 1. Interconnect 28 is electrically connected to p-contact 20. Interconnects 26 and 28 are electrically isolated from the n- and p-contacts 22 and 20 and from each other by dielectric layer 24, shown hatched, and gap 27. Interconnects 26 and 28 may be, for example, solder, stud bumps, gold layers, or any other suitable structure. Many individual LEDs 12 may be formed on a single wafer then diced from a wafer of devices, as described below.

Though the embodiments below show separating a wafer into individual LEDs 12, the techniques described may be used to separate a wafer into groups of LEDs. Though the embodiments below refer to a sapphire growth substrate, the techniques described may be applied to any suitable substrate.

One embodiment of the invention is illustrated in FIGS. 2, 3, 4, 5, and 6. In the embodiment illustrated in FIGS. 2-6, the substrate 10 is thinned, then scribed, then thinned again.

Figure 2:
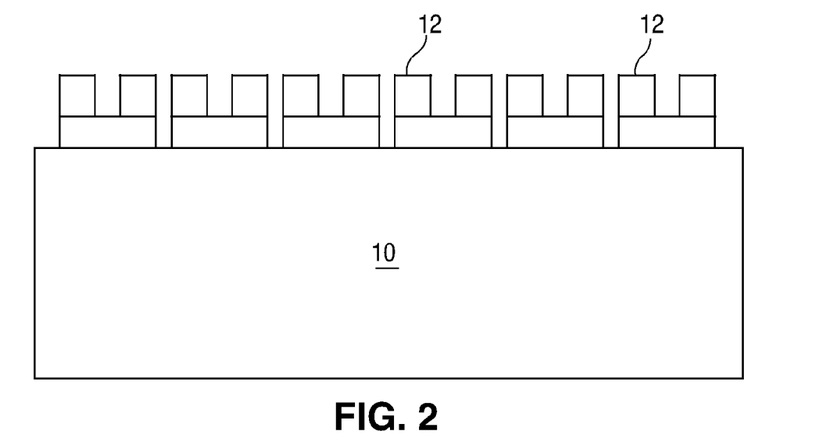
FIG. 2 illustrates a portion of a wafer of LEDs formed on a substrate.

In FIG. 2, an exemplary group of several LEDs 12 is formed on a substrate 10. For example, LEDs 12 may be the devices illustrated in FIG. 1 or any other suitable device. Although six LEDs 12 are shown, there is no expressed limit to the number of LEDs that may be created on a single substrate, nor are these LEDS required to be in a group. The LEDs in the figure are simply examples of a "some" LEDs on a portion of a substrate 10 or a complete substrate 10.

Figure 3:
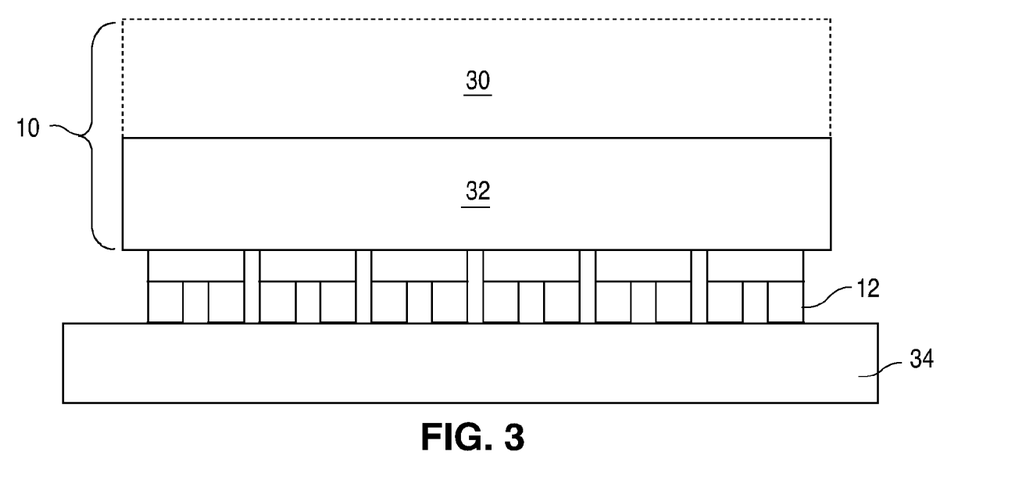
FIG. 3 illustrates the structure of FIG. 2 after attaching the wafer to handling tape and thinning the substrate.

In FIG. 3, wafer handling tape 34 is attached to LEDs 12. A portion 30 of the thickness of the growth substrate 10 is removed by any suitable technique such as, for example, mechanical techniques such as grinding leaving a remaining portion 32. The substrate 10 is thinned to a thickness which accommodates the scribing described in FIG. 4. The thickness of the substrate 10 in FIG. 2 before thinning may be, for example, at least 300 µm thick in some embodiments and no more than 1500 µm thick in some embodiments, though the substrate may be thicker than 1500 µm in some embodiments. The remaining portion 32 of substrate 10 may be, for example, no more than 300 µm thick in some embodiments, no more than 275 µm thick in some embodiments, and no more than 250 µm thick in some embodiments.

Figure 4:
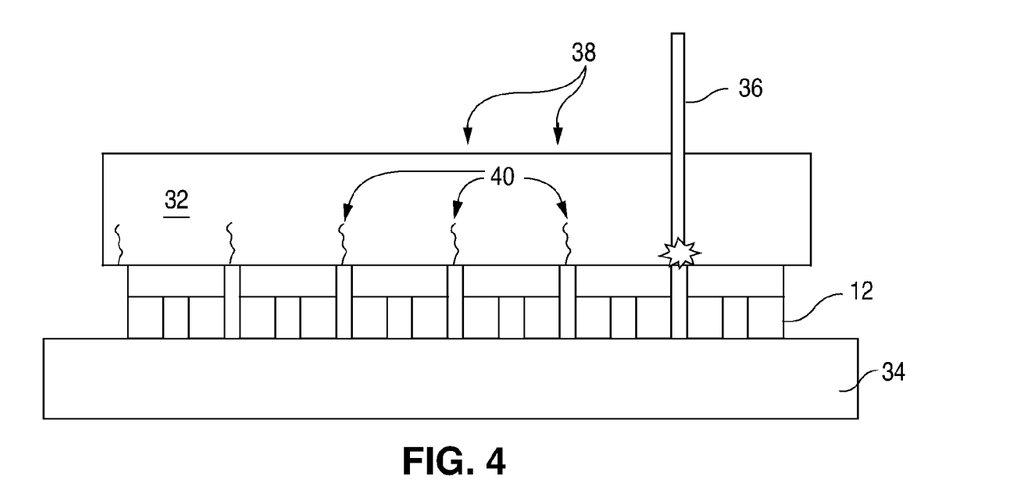
FIG. 4 illustrates the structure of FIG. 3 after scribing the substrate.

In FIG. 4, the regions 38 between individual LEDs 12 or groups of LEDs 12 are scribed to form cracks or notches 40 in the remaining portion of substrate 32. The cracks 40 are localized in a portion of the thickness of the substrate 32 that is closest to LEDs 12. The cracks 40 do not fully penetrate the remaining portion of substrate 32. Cracks 40 may be formed by, for example, laser scribing, where a laser 36 is shined through the substrate 32 in regions 38, or stealth dicing, where a modified layer in the substrate is formed by focusing a laser inside the substrate. For example, a femtosecond laser with wavelengths between 266 and 355 nm may be used for laser scribing and a laser with wavelengths between 800 and 1100 nm may be used for stealth dicing.

Figure 5:
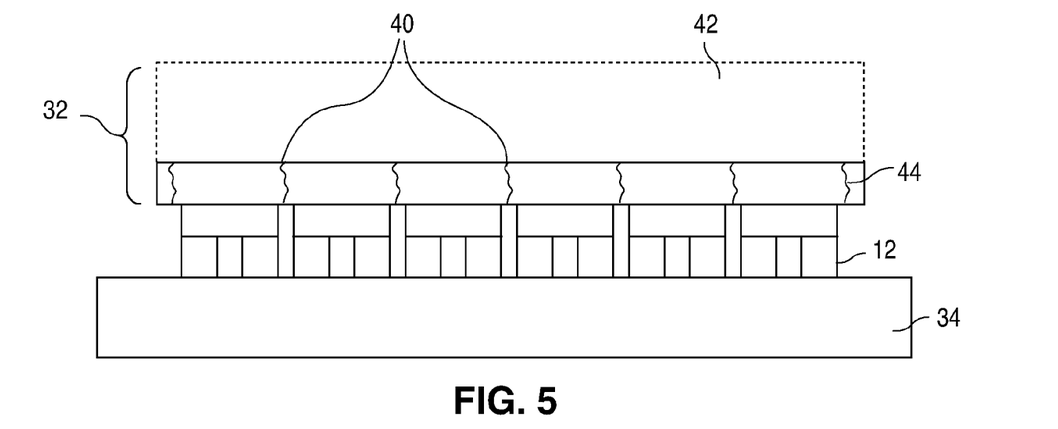
FIG. 5 illustrates the structure of FIG. 4 after thinning the substrate.

In FIG. 5, the remaining portion 32 of the sapphire substrate 10 is then thinned to expose the tops of cracks 40 formed in FIG. 4. The substrate may be thinned by any suitable technique including mechanical techniques such as grinding. The thickness of the removed portion 42 of remaining portion 32 may be at least 100 µm thick in some embodiments and no more than 200 µm thick in some embodiments. The cracked portion 44 remaining after thinning may be, for example, no more than 60 µm thick in some embodiments, no more than 50 µm thick in some embodiments, and no more than 40 µm thick in some embodiments. The cracked portion 44 remaining after thinning is sufficiently thick in some embodiments to mechanically support the semiconductor structure. After the thinning illustrated in FIG. 5, some or all of the cracks 40 extend through the entire remaining thickness of cracked portion 44. Preferably all of the cracks 40 extend through the entire remaining thickness of cracked portion 44.

Figure 6:
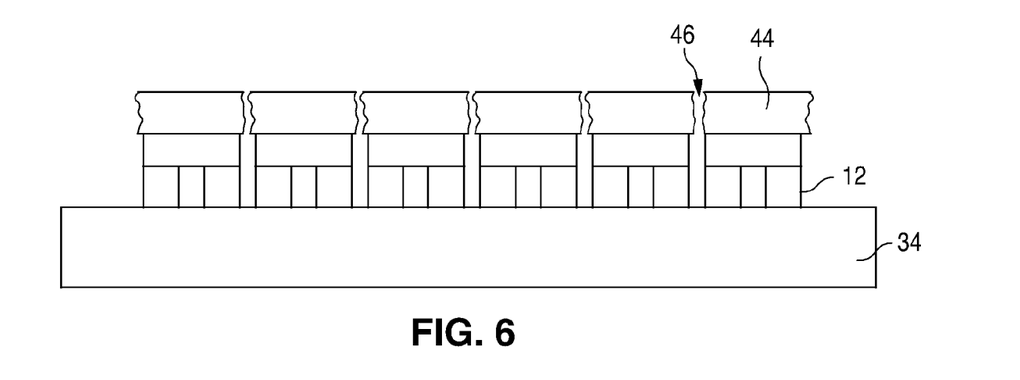
FIG. 6 illustrates the structure of FIG. 5 after stretching the handling tape to separate the LEDs.

In FIG. 6, tape 34 may be stretched to separate individual LEDs 12 or groups of LEDs 12 in the gaps 46 where cracks 40 were formed. Each LED 12 or group of LEDs 12 has a small piece of substrate 10 (cracked portion 44) attached to the top of the semiconductor structure. The cracked portion 44 may be thick enough to mechanically support the semiconductor structure. The cracked portions 44 may have smooth or rough edges.

Another embodiment is illustrated in FIGS. 7, 8, 9, 10, and 11. In the embodiment illustrated in FIGS. 7-11, the substrate is etched, then thinned.

Figure 7:
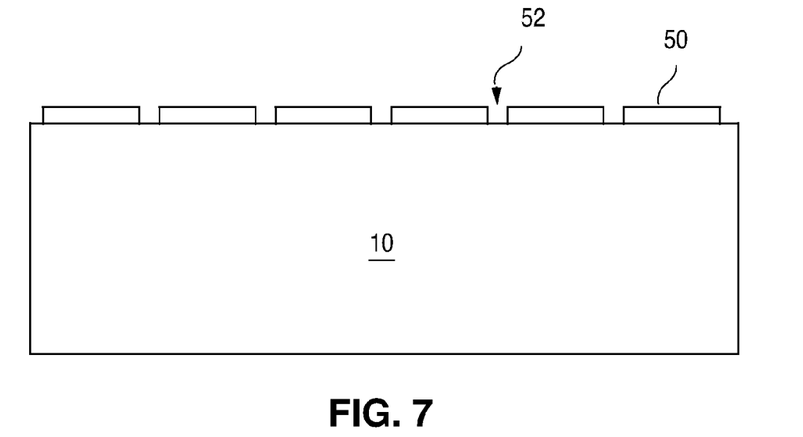
FIG. 7 illustrates a mask applied to a portion of a substrate.

In FIG. 7, a mask 50 is formed over a sapphire substrate 10 and patterned to form openings 52 aligned with areas where the substrate is later separated. The openings 52 may correspond to the edges of a single LED or multiple LEDs in a group. The semiconductor structure may be grown on substrate 10 before or after forming openings 52. The semiconductor structure may be patterned such that the semiconductor structure is removed from regions between LEDs.

Figure 8:
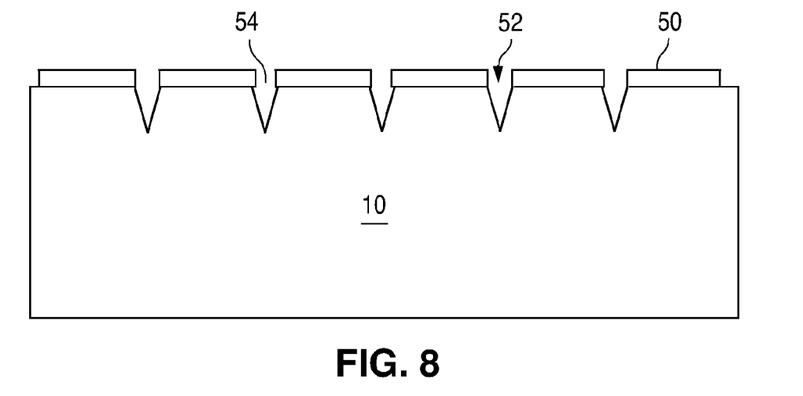
FIG. 8 illustrates the structure of FIG. 7 after etching notches in the substrate.

In FIG. 8, the sapphire substrate 10 is etched to form notches 54 in substrate 10 in the openings 52 in mask 50. In some embodiments, notches 54 are at least one micron deep. In some embodiments, notches 54 are at least one micron wide. The substrate 10 is etched by any suitable technique such as, for example, dry etching or wet etching.

Figure 9:
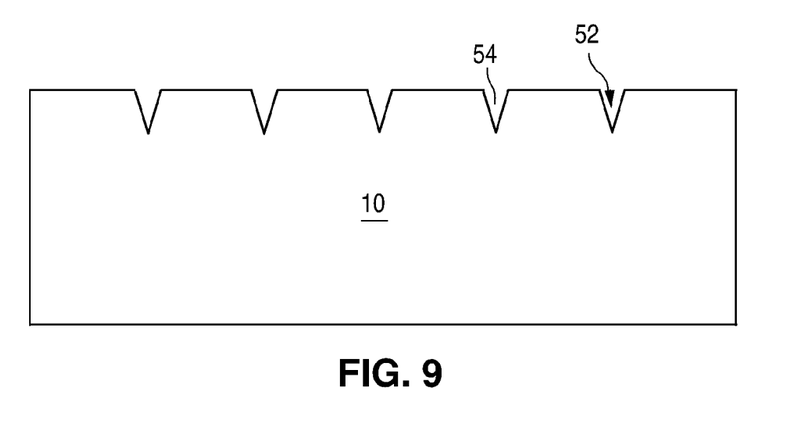
FIG. 9 illustrates the structure of FIG. 8 after stripping the mask.

In FIG. 9, the mask 50 is stripped, leaving substrate 10 with notches 54 formed in regions 52.

As an alternative to the masking, etching, and stripping technique illustrates in FIGS. 7, 8, and 9, in some embodiments, before growing the semiconductor structure of LEDs 12, notches are formed in the substrate 10 by a technique other than etching. For example, notches 54 may be formed by laser scribing or stealth dicing, as described above, by laser dicing with a UV laser with a wavelength between 266 and 355 nm, or by mechanical dicing, for example using a blade. Such techniques may not require first masking the substrate, though a patterned mask may be used.

Figure 10:
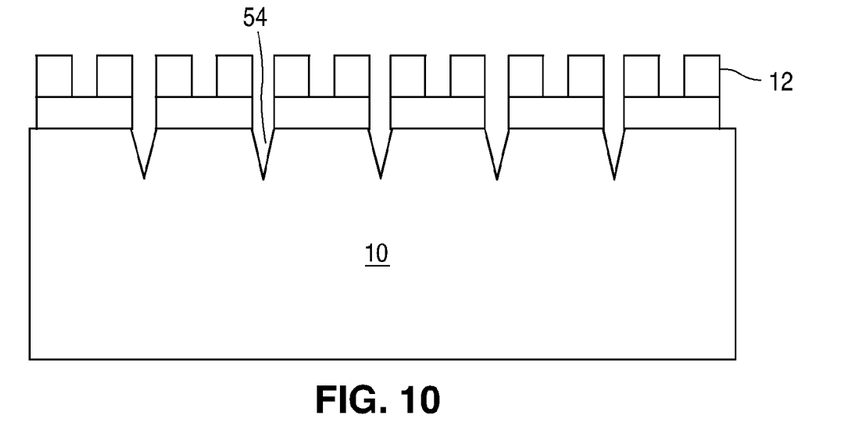
FIG. 10 illustrates the structure of FIG. 9 after forming LEDs on the notched substrate.

In FIG. 10, LEDs 12 are formed in the regions between notches 54. For example, the semiconductor structures grown on substrate 10 may be formed into LEDs by etching and forming metal layers to form contacts and interconnects, as described above in reference to FIG. 1.

Figure 11:
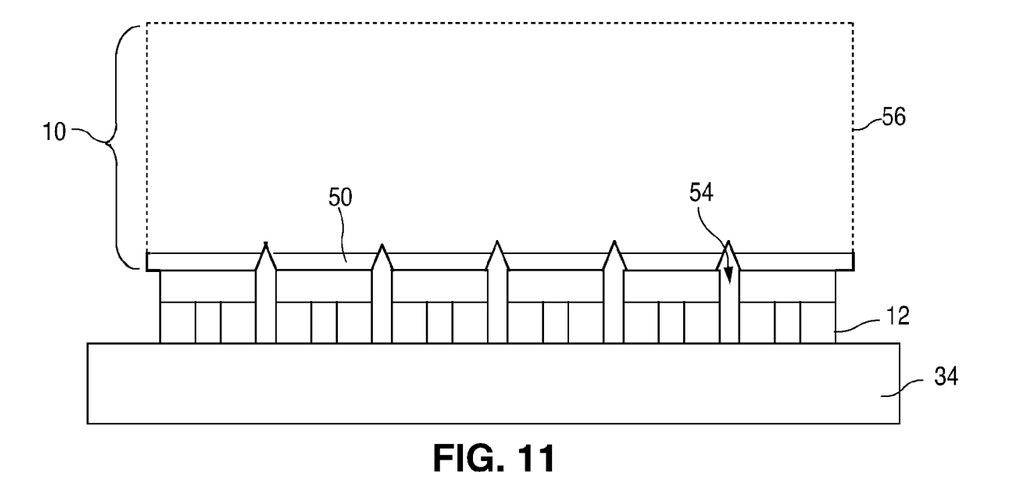
FIG. 11 illustrates the structure of FIG. 10 after attaching the wafer to handling tape and thinning the substrate to separate the LEDs.

In FIG. 11, the LEDs 12 are connected to wafer handling tape 34. Substrate 10 is thinned by any suitable technique, as described above. The portion 56 of the substrate 10 that is removed is sufficiently thick that some or all of notches 54 are exposed, separating individual LEDs 12 or groups of LEDs. Preferably all notches 54 are exposed. A portion 50 of substrate 10 remains attached to each LED 12 or group of LEDs. Portion 50 is sufficiently thick in some embodiments to mechanically support the semiconductor structure of LEDs 12.

Another embodiment is illustrated in FIGS. 12, 13, 14, and 15. In the embodiment illustrated in FIGS. 12-15, the LEDs are partially formed, the substrate is notched, the LEDs are completed, then the substrate is thinned.

Figure 12:
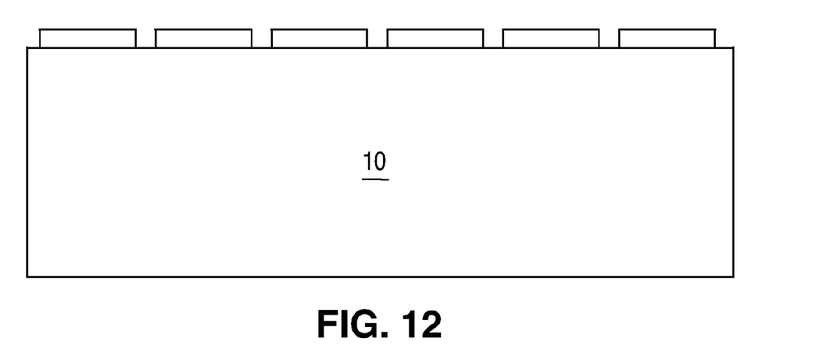
FIG. 12 illustrates a portion of a substrate including partially formed LEDs.

In FIG. 12, LEDs are partially formed on substrate 10. For example, the semiconductor structure of the LEDs may be grown on substrate 10.

Figure 13:
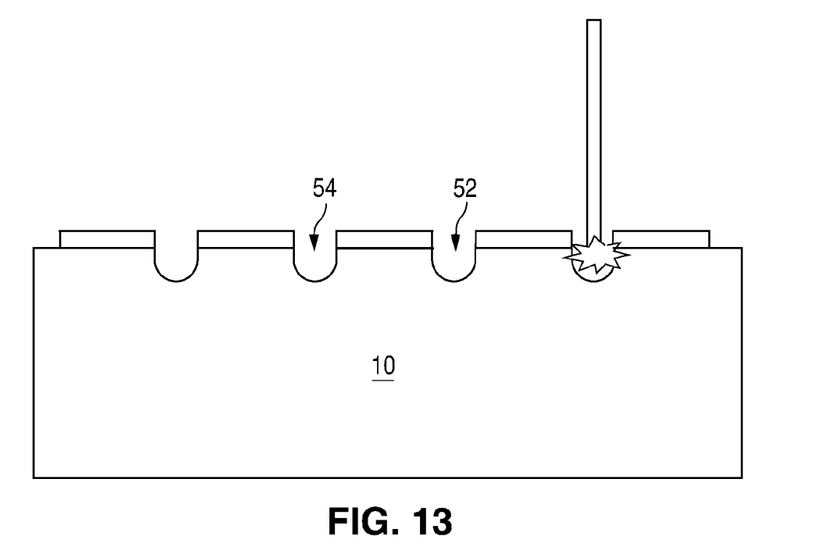
FIG. 13 illustrates the structure of FIG. 12 after forming notches in the substrate.

In FIG. 13, notches 54 are formed in the substrate 10 in the regions 52 between individual LEDs or between groups of LEDs. Notches 54 may be formed by any suitable technique, including, for example, etching, sawing, or laser scribing.

Figure 14:
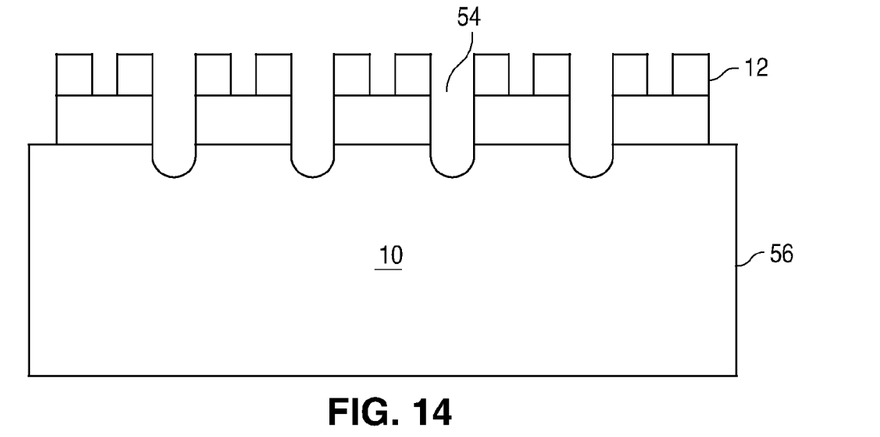
FIG. 14 illustrates the structure of FIG. 13 after finishing the LEDs.

In FIG. 14, the LEDs 12 are completed for example by etching and forming metal layers to form contacts and interconnects, as described above in reference to FIG. 1.

Figure 15:
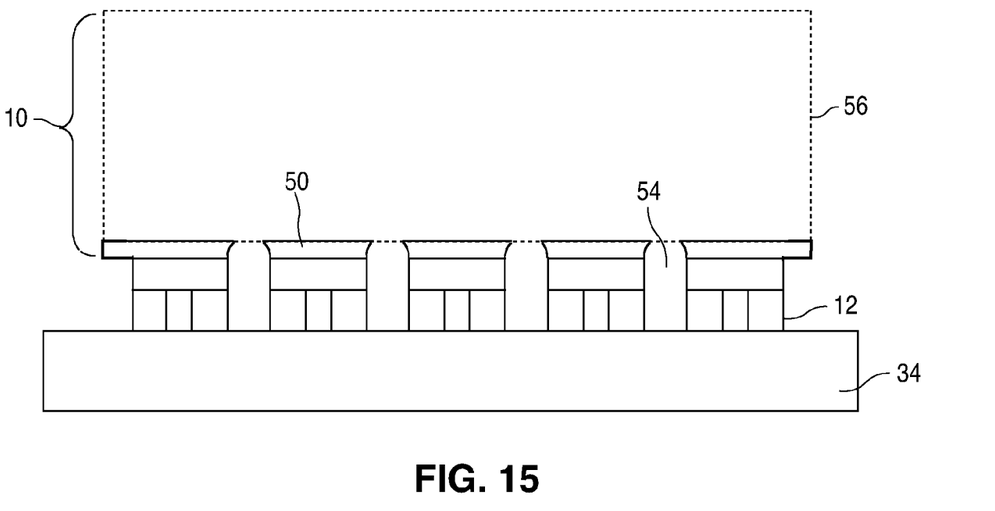
FIG. 15 illustrates the structure of FIG. 14 after attaching the wafer to handling tape and thinning the substrate to separate the LEDs.

In FIG. 15, the LEDs 12 are connected to wafer handling tape 34. Substrate 10 is thinned by any suitable technique, as described above. The portion 56 of the substrate 10 that is removed is sufficiently thick that some or all of notches 54 are exposed, separating individual LEDs 12 or groups of LEDs. Preferably all notches 54 are exposed. A portion 50 of substrate 10 remains attached to each LED 12 or group of LEDs. Portion 50 is sufficiently thick in some embodiments to mechanically support the semiconductor structure of LEDs 12.

Figure 16:
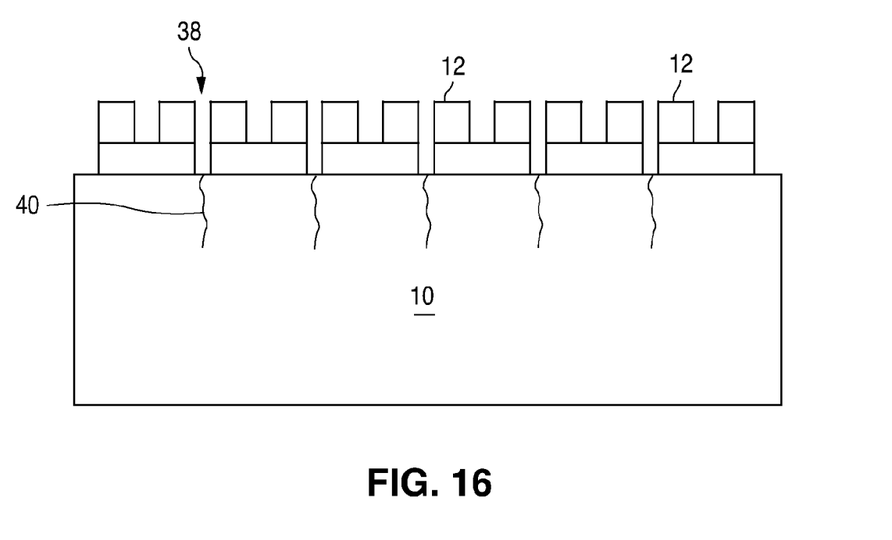
FIG. 16 illustrates a portion of a wafer of LEDs formed on a substrate, with cracks formed between neighboring LEDs.
Figure 17:
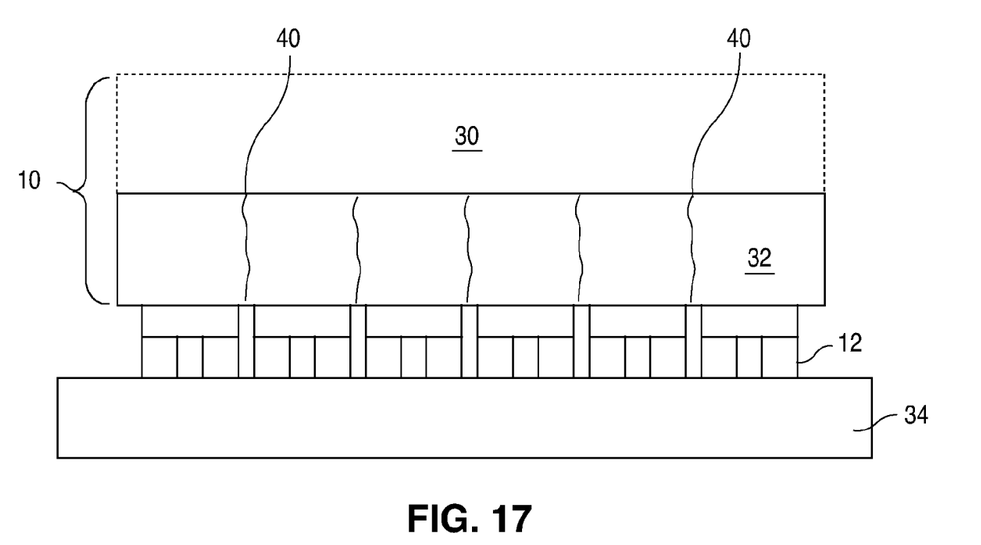
FIG. 17 illustrates the structure of FIG. 16 after thinning the substrate.

Another embodiment is illustrated in FIGS. 16 and 17. In FIG. 16, LEDs 12 are grown on a substrate 10. For example, LEDs 12 may be the devices illustrated in FIG. 1 or any other suitable device. Regions 38 between individual LEDs 12 or groups of LEDs 12 are laser scribed from the side of the substrate 10 on which LEDs 12 are formed. The scribing forms cracks or notches 40 in a portion of the thickness of substrate 10. The cracks 40 are localized in a portion of the thickness of the substrate that is closest to LEDs 12. Cracks 40 may be, for example, at least 30 μm deep in some embodiments, and no more than 100 μm in some embodiments.

LEDs 12 is then mounted on a structure 34 such as a frame, support wafer, or handling tape, as shown in FIG. 17. A portion 30 of the thickness of the growth substrate 10 is removed by any suitable technique such as, for example, mechanical techniques such as grinding. The thickness of the substrate 10 before thinning may be, for example, between 300 and 2000 μm. In some embodiments, the substrate is thinned beyond a thickness where some or all of the tops of cracks 40 (in the orientation illustrated in FIG. 17) are reached. Preferably all of the tops of cracks 40 are reached. The remaining portion 32 of substrate 10 is sufficiently thick to mechanically support the semiconductor structure of LEDs 12 in some embodiments.

Light emitting devices formed by the techniques described above may have several advantages. Because some of the substrate remains attached to the final device, the fragile semiconductor structure is supported by the substrate, which may reduce the occurrence of failure due to cracking, may eliminate the need for expensive and complex thick metal interconnects that support the semiconductor structure, and may eliminate the need for underfill or other structures to support the semiconductor structure. The device can be solder mounted. In addition, because the substrate is thinned, the amount of light that escapes through the sides of the substrate may be reduced as compared to a device where the entire thickness of the substrate remains attached to the semiconductor structure. Accordingly, devices formed by the techniques described above may avoid or reduce an efficiency penalty typically associated with devices where the substrate remains attached to the semiconductor structure.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A method comprising:
   at least partially forming a light emitting semiconductor structure on a growth substrate, the light emitting semiconductor structure comprising a light emitting layer disposed between an n-type region and a p-type region, the growth substrate comprising a front side and a back side opposite the front side, the light emitting semiconductor structure being grown on the front side;
   after at least partially forming the semiconductor structure on the growth substrate, forming a plurality of openings in the light emitting semiconductor structure that expose portions of the front side of the substrate, and forming notches in portions of the front side of the growth substrate that are exposed in the openings, each of the notches extending from the front side of the growth substrate into the growth substrate, each of the notches having respective sides that are inclined towards one another and meet at a bottom of the notch;

after forming the notches in the growth substrate, completing a plurality of LEDs on the growth substrates by processing the light emitting semiconductor structure on the growth substrate; and after completing the LEDs on the growth substrate, thinning the back side of the growth substrate to expose the notches and separate the completed LEDs.

2. The method of claim 1, wherein the notches are formed using at least one of dry etching and wet etching.

3. The method of claim 1, wherein forming notches in the growth substrate comprises sawing or laser scribing the notches in the growth substrate.

4. The method of claim 1, wherein the growth substrate is sapphire.

5. The method of claim 1, wherein, after thinning the back side of the growth substrate, a portion of the growth substrate remains attached to each of the completed LEDs.

6. A method comprising:

at least partially forming a light emitting semiconductor structure on a growth substrate, the light emitting semiconductor structure comprising a light emitting layer disposed between an n-type region and a p-type region, the growth substrate comprising a front side and a back side opposite the front side, the light emitting semiconductor structure being grown on the front side;

after at least partially forming the semiconductor structure on the growth substrate, forming a plurality of openings in the light emitting semiconductor structure that expose portions of the front side of the substrate, and forming notches in portions of the front side of the growth substrate that are exposed in the openings, each of the notches extending from the front side of the growth substrate into the growth substrate, each of the notches having a U-shape;

after forming the notches in the growth substrate, completing a plurality of LEDs on the growth substrates by processing the light emitting semiconductor structure on the growth substrate; and after completing the LEDs on the growth substrate, thinning the back side of the growth substrate to expose the notches and separate the completed LEDs.

7. The method of claim 6, wherein the notches are formed using at least one of dry etching and wet etching.

8. The method of claim 6, wherein forming notches in the growth substrate comprises sawing or laser scribing the notches in the growth substrate.

9. The method of claim 6, wherein the growth substrate is sapphire.

10. The method of claim 6, wherein, after thinning the back side of the growth substrate, a portion of the growth substrate remains attached to each of the completed LEDs.

* * * * *